United States Patent [19]
Gentsu

[11] Patent Number: 6,102,531
[45] Date of Patent: Aug. 15, 2000

[54] PIEZOELECTRIC FILM TYPE ACTUATOR AND INK JET PRINTER HEAD HAVING THE SAME

[76] Inventor: Takuya Gentsu, c/o Kyocera Corporation, Kagoshima Kokubu Factory, 1-1, Yamashita-cho, Kokubu-shi, Kagoshima, Japan

[21] Appl. No.: 09/218,943

[22] Filed: Dec. 22, 1998

[30] Foreign Application Priority Data

Dec. 25, 1997 [JP] Japan .................................. 9-358308

[51] Int. Cl.⁷ ........................................ B41J 2/045
[52] U.S. Cl. ............................ 347/72; 310/328; 310/358
[58] Field of Search ................................. 347/68–71, 58, 347/54, 72, 20, 12, 67, 14, 17; 29/25.35, 890.1

[56] References Cited

U.S. PATENT DOCUMENTS 5,617,127  4/1997  Takeuchi et al. ......................... 347/71
5,691,752  11/1997  Moynihan et al. ....................... 347/68

FOREIGN PATENT DOCUMENTS

408305 B1  3/1996  European Pat. Off. ........ H01L 41/09
3128680    5/1991  Japan .

*Primary Examiner*—John Barlow
*Assistant Examiner*—Raquel Yvette Gordon
*Attorney, Agent, or Firm*—Hogan & Hartson LLP

[57] ABSTRACT

A piezoelectric film type actuator, which achieves large displacement by the traverse effect of electric-field-induced distortion with low voltage and is quick in response and wherein wiring patterns to electrodes may be simplified or may not be needed at all without giving adverse effect to the displacement of the thin substrate 1 should be provided. A piezoelectric film type actuators is produced by laminating a piezoelectric film 3 onto the thin substrate 1 through an intermediate layer 2 containing 40% or more platinum (Pt) or palladium (Pd) by weight attached on the thin substrate 1, and further laminating an electrode film 4 on the piezoelectric film 3.

16 Claims, 3 Drawing Sheets

PIEZOELECTRIC FILM TYPE ACTUATOR AND INK JET PRINTER HEAD HAVING THE SAME

BACKGROUND OF THE INVENTION

1. Field of the Invention

The present invention relates to piezoelectric film type actuators comprising a piezoelectric film and electrode films laminated integrally on the thin substrate, to be used in ink jet printer heads, microphones, vibrators, oscillators, various kinds of displacement sensors, pumps and switches.

2. Prior Art

In recent years, it has been required to control the positioning of elements on the sub-micron order in the precision and optical industries. To this end, piezoelectric film type actuators have been used, utilizing displacement caused by the inverse piezoelectric effect and electrostrictive effect or the reversed phenomenon generated when electric field is applied to piezoelectric or electrostrictive materials such as ferroelectrics.

In ink jet printer heads, for instance, piezoelectric film type actuators of unimorph and bimorph types have been used, but more compact actuators with higher density of piezoelectric film elements, with lower operable voltage and higher response speed, and with other higher performance have been needed.

The typical structure of a piezoelectric film type actuator is shown in FIG. 4. This conventional actuator is, generally called unimorph type, comprised of a thin substrate 21 made of insulating ceramics on which a lower electrode film 22, a piezoelectric film 23 and an upper electrode film 24 are laminated in this order into one piece, by using a filmmaking technique such as the screen printing method.

This piezoelectric/electrostrictive actuator, comprised of the thin substrate 21 and the piezoelectric/electrostrictive actuating part 25 formed on said thin substrate by laminating a lower electrode film 22, a piezoelectric film 24 and a upper electrode film 23, can obtain large displacement by traverse effect of the distortion induced by electric field, and is operable with low voltage and quick in response.

However, in these actuators, because wiring patterns 26 and 27 must be formed on the thin substrate 21 to maintain electric continuity to the lower electrode film 22 and the upper electrode film 24, if a plurality of piezoelectric/electrostrictive driving parts 25 are formed on the thin substrate 21, it becomes difficult and complex to draw wiring patterns 26 and 27 to the electrode films 22 and 24 on the substrate and the complexly patterned wires may affect the displacement of the thin substrate 21 adversely.

In order to solve this problem, it has been proposed to create a piezoelectric/electrostrictive actuator by forming a thin substrate with conductive ceramics to enable the thin substrate to serve as an electrode, on which a piezoelectric film and the other electrode film are directly laminated integrally. This piezoelectric/electrostrictive actuator may exhibit an advantage that wiring patterns are not needed to be printed on the substrate, which serves as one of the electrodes.

However, if a piezoelectric film is directly laminated onto a thin substrate, there is another problem that the required piezoelectric/electrostrictive property can not be obtained because the piezoelectric film 23 is not densified enough as it is heat treated for lamination.

To describe specifically, when heat treated, the previously sintered substrate tends to expand, and then the piezoelectric film formed on the substrate shrinks during sintering. Thus, the expansion of the substrate prevents contracting piezoelectric film, resulting in hindering the piezoelectric film to be made dense. Accordingly, in this method, the required piezoelectric/electrostrictive characteristics can not be obtained.

There is also another problem in that the piezoelectric film is heated. Namely, the conductive ceramic constituting the thin substrate reacts with the piezoelectric film, then deteriorating its piezoelectric/electrostrictive property.

Moreover, when conductive ceramics constituting the thin substrate is alumina or zirconia ceramics, which contains a conductive additive, if the amount of the conductive additive is excessive, the thin substrate becomes significantly weak, and not strong enough to be used as the vibrating plate. Thus, the specific electric resistance cannot be lowered sufficiently. Accordingly, it is difficult to use such ceramics as an electrode material.

SUMMARY OF THE INVENTION

An object of the present invention is to provide a piezoelectric film type which use a electric conductive substrate capable of serving as an electrode, having the strength and conductivity after sintering the lamination structure, without degrading the piezoelectric/electrostrictive materials during the heat treatment.

In the invention, conductive ceramics having perovskite crystal structure are usable for the thin substrate. The present invention places an intermediate layer containing platinum (Pt) or palladium (Pd) between the thin conductive substrate and the piezoelectric film to provide a piezoelectric film type actuator which operates with low voltage and can obtain large displacement with quick response, allowing wiring patterns to the electrodes to be simplified or not be necessary at all.

Accordingly, the present invention is a piezoelectric film type actuator comprising a thin substrate made of conductive ceramics having perovskite crystal structure, a piezoelectric film laminated on said substrate via a intermediate layer containing 40% or more by weight of platinum (Pt) or palladium (Pd) placed on said thin substrate, and an electrode film located on said piezoelectric film.

In order to ensure large displacement of said piezoelectric film type actuator, the specific electric resistance of the conductive ceramics having perovskite crystal structure and constituting said thin substrate should desirably not exceed 1 Ω.cm. To obtain these properties, the thin substrate may be made of conductive ceramics expressed in the following composition formula.

$$(La_{1-x-y}A_xCa_{y+z})k(B_mCr_{1-m})O_3$$

where, A: Sr or/and Ba, and B: One or more elements selected from the group of Mg, Zr, Ce, Mn, Fe, Co and Ni, $0.01 \leq x+y \leq 0.70$, $0<z \leq 0.1$, $0.90 \leq k \leq 1.05$ and, $0 \leq m \leq 1.0$.

In addition, in the present invention, to enhance the bonding strength between the thin substrate and the piezoelectric film, as well as to obtain the required piezoelectric/electrostrictive property, said intermediate layer is made of a composite which contains platinum (Pt) or palladium (Pd) and one ore more compounds of lead zirconate tinanate, lead—magnesium niobate, lead—nickel niobate, lead antimonate-stannate, lead titanate and barium titanate.

BRIEF DESCRIPTION OF THE DRAWINGS

Embodiments of the present invention will be described in further detail below with reference of the accompanying drawings, in which.

EMBODIMENTS OF THE INVENTION

Figure 1:
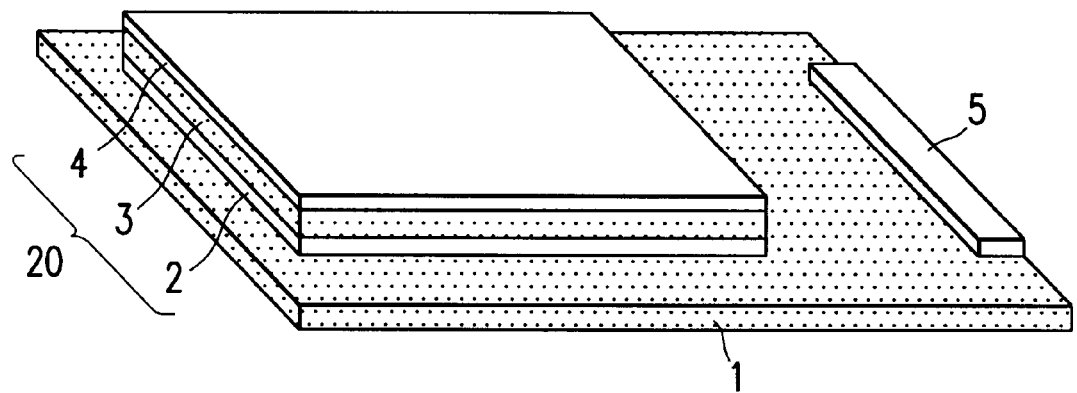
FIG. 1 shows a perspective view of a piezoelectric film type actuator of the present invention.

FIG. 1 shows a example of the piezoelectric film type actuator of the present invention. This actuator, generally called "unimorph type," is comprised of a thin substrate 1 made of conductive ceramics having perovskite crystal structure, an intermediate conductive layer 2 containing 40% or more of platinum (Pt) or palladium (Pd) by weight disposed on said thin substrate, a piezoelectric film 3 laminated on the main surface of said thin substrate 1 via said intermediate layer 2, and an electrode film 4 laminated on said piezoelectric film 3. The intermediate layer 2, piezoelectric film 3, and electrode film 4 are laminated integrally on the thin substrate 1 by heat treatment.

Figure 2:
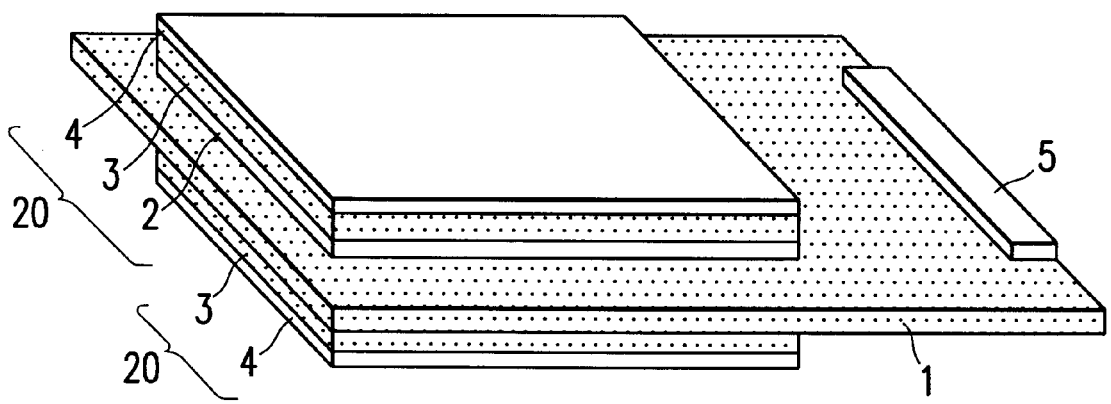
FIG. 2 shows a perspective view of another example of the piezoelectric film type actuator of the present invention.

FIG. 2 shows the perspective view of another example of the piezoelectric film type actuator. This actuator, generally referred to as "bimorph type actuator," comprises a thin substrate 1 made of a conductive ceramics having perovskite crystal structure, two intermediate conductive layers 2 and 2 containing 40% or more of platinum (Pt) or palladium (Pd) by weight provided on the top and the back surfaces of the thin substrate 1, two piezoelectric films 3 and 3 laminated on said thin substrate 1 via said corresponding intermediate layers 2 and 2, and two electrode films laminated on the corresponding piezoelectric films 3. Namely, two sets of the piezoelectric driving elements 20 and 20 each which comprises a intermediate layer 2, a piezoelectric film 3, and an electrode films 4 are laminated integrally with the top and the back surfaces of the thin substrate 1 by heat treatment.

In the piezoelectric film type actuator as shown in FIGS. 1 and 2, because the piezoelectric film 3 and the electrode film 4 are laminated integrally with the thin substrate 1, the actuator can be operable with low voltage to obtain large displacement by traverse effect of the distortion induced by electric field with high response speed and great integration of plurality of actuators obtained. Moreover, because the thin electrode serves as an electrode, wiring patterns are not needed, which makes designing of the piezoelectric film type actuator simpler. The piezoelectric film type actuators shown in FIGS. 1 and 2 has an electrode terminal 5 drawn from thin substrate 1, and power electricity is carried to the electrode film 4 by contacting a lead directly to the electrode terminal 15.

Figure 3A:
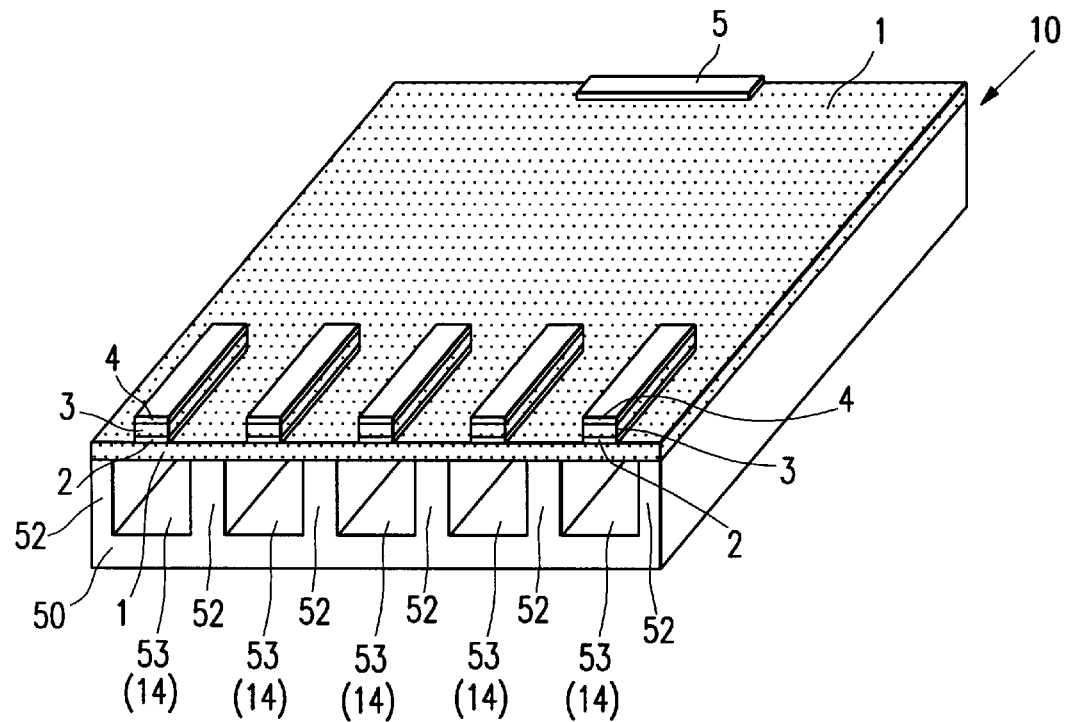
FIG. 3A shows a perspective view of a piezoelectric film type actuator used for a ink jet printer according to a embodiment of the invention.
Figure 3B:
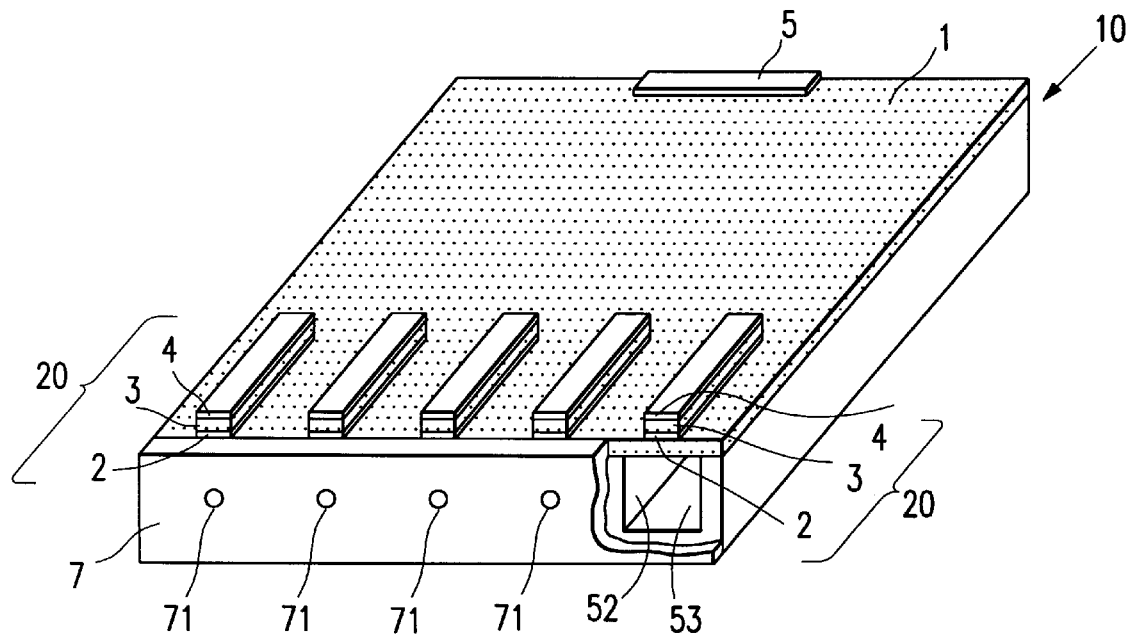
FIG. 3B shows a perspective view of an ink jet printer head in which the piezoelectric film type actuator of the present invention is used; and, FIG. 4 shows a perspective view of a typical piezoelectric film type actuator.
Figure 4:
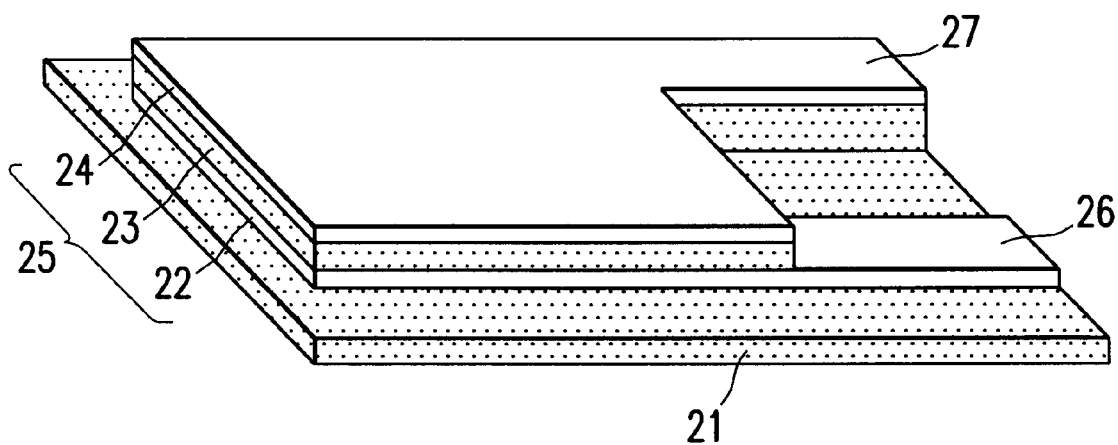

Another example of the embodiment of the piezoelectric film type actuator in FIG. 1 used in an ink jet printer head 10 is shown in FIGS. 3A and 3B. This ink jet printer head 10 has ink chambers 14 which are defined by a number of concave grooves 53 divided by partition walls 52 of the base frame 50. A thin substrate 1 made of conductive ceramics having perovskite crystal structure covers said concave grooves 53. Many of piezoelectric driving elements, each which comprises an intermediate layer 2, a piezoelectric film 3, and an electrode films 4 which are laminated integrally, are fixed to the corresponding areas on said thin substrate under which individual ink chambers 14 are defined, which constitute piezoelectric film type actuators. Because intermediate layers 2, piezoelectric films and electrode films 4 are directly laminated on the thin substrate 1 in this structure, it is easy to dispose plurality of piezoelectric film type actuators densely. Also, the structure of the actuating part is made very simple, because particular wiring patterns are not needed on the substrate except the electrode terminal 5 which is provided on the rear side of the thin substrate 1.

Therefore, by applying electricity of low voltage between the thin substrate 1 and each of the electrodes 4 of any desired actuators, the corresponding piezoelectric film type actuators is displaced significantly, and pressure of ink inside the ink chambers 53 of the actuators is raised instantly by said displacement. Then, droplets of ink is dispensed from the nozzles 71 of the activated ink chambers 14 as shown in FIG. 3B by the raised pressure, thus obtaining a ink jet printer head 10 capable of printing at high speed.

It should be noted because the thin substrate 1 serves as both the vibrating plate and the electrode in the actuators as shown in FIGS. 1 and 2, the thin substrate 1 should be made of conductive ceramics which has specific resistance not more than 1 Ω.cm at room temperature (25° C.) and which maintain the specific resistance not more than 1 Ω.cm after said ceramics is heated in the air atmosphere at a temperature of 600° C. or more.

This reason is that the piezoelectric/electrostrictive property of the piezoelectric film 3 is adversely affected as the specific resistance of the thin substrate 1 is larger than 1 Ω.cm. During laminating the intermediate layer 2, the piezoelectric film 3 and the electrode film 4 on the thin substrate 1, they are heated at a temperature of 600° C. or more. If the thin substrate 1 has specific resistance of higher than 1 Ω.cm after heated in the air atmosphere at 600° C. or higher temperature, the piezoelectric/electrostrictive property may be adversely affected as described above. The specific resistance of the thin substrate 1 should be preferably $10^{-1}$ Ω.cm or less, and furthermore preferably $10^{-3}$ Ω.cm or less.

To satisfy this requirement, conductive ceramics for the piezoelectricity is desirably to have perovskite crystal structure. Specifically, conductive ceramics expressed in the following composition formula may be used.

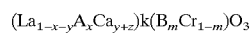

$$(La_{1-x-y}A_xCa_{y+z})k(B_mCr_{1-m})O_3$$

where, A is Sr or/and Ba, and B is one or more elements selected from the group of Mg, Zr, Ce, Mn, Fe, Co and Ni, and, $0.01 \leq x+y \leq 0.70$, $0 < z \leq 0.1$, $0.90 \leq k \leq 1.05$ and, $0 \leq m \leq 1.0$.

As a material used for the piezoelectric film 3 to be subjected to be displaced by application of electric field, a material of one compound selected from the group of lead zirconate-titanate (PZT), lead—magnesium niobate (PMN), lead—nickel niobate, lead antimonate-stannate, lead titanate or barium titanate, as a main component. Also a composite material made of the above mentioned compounds may be used and preferably the piezoelectric film 3 may be formed of a mixture material comprising lead—magnesium niobate, lead zirconate and lead titanate as main components, or a mixture material containing lead—nickel niobate, lead—magnesium niobate, lead zirconate and lead titanate as main components.

Materials suitable for the electrode 4 which is formed on the piezoelectric film 3 may be electrode materials containing a metal with high melting point such as platinum, gold, palladium and rhodium, or an alloy such as silver—platinum alloy, silver—palladium alloy and platinum—palladium alloy as a main ingredient.

It is important to use a material containing platinum (Pt) or palladium (Pd) as a intermediate layer 2 which bonds said piezoelectric film 3 to the thin substrate 1.

Platinum or palladium works to restrain the reaction between the piezoelectric film 3 and the thin substrate 1 when they are heated, thus, preventing the piezoelectric/electrostrictive property from being degraded.

However, this resistant effect against the reaction between the thin substrate 1 and the piezoelectric film 3 will reduce if platinum (Pt) or palladium (Pd) is contained less than 40% of the total weight in the intermediate layer 2. Accordingly, the intermediate layer 2 should be made of materials containing 40% or more platinum (Pt) or palladium (Pd) by weight. The intermediate layer 2 may be a composite material containing, in addition to platinum (Pt) or palladium (Pd), one or more compounds selected from a group of lead zirconate-titanate (PZT), lead—magnesium niobate (PMN), lead—nickel niobate, lead antimonate-stannate, lead titanate and barium titanate, which are the same materials as used in the piezoelectric film 3. By including such materials as used in the piezoelectric film, the bonding strength is reinforced because the intermediate layer 2 may have no difference in thermal expansion from that of the piezoelectric film 3.

To measure a content of platinum (Pt) or palladium (Pd) in the intermediate layer 2, X-ray fluorescence analysis or electron spectroscopic analysis may be used.

To achieve the intended extent of displacement of the thin substrate 1 by distortion or bent of the piezoelectric film 3 as designed, the thickness of the intermediate layer 2 may be in a range of 1 to 5 $\mu$m, and preferably 3 to 4 $\mu$m. This is because if the intermediate layer 2 is thicker than 5 $\mu$m, displacement of the piezoelectric film 3 is absorbed by the intermediate layer 2, resulting in failure to achieve the desired extent of displacement of the thin substrate 1. On the other hand, if the thickness is less than 1 $\mu$m, it is difficult to form the intermediate layer 2 with uniform thickness over the film. If pin holes exist in the intermediate film 2, the piezoelectric film 3 easily reacts to the thin substrate 1 through such pin holes, resulting in deterioration of the piezoelectric/electrostrictive property of the piezoelectric film 3.

To produce the piezoelectric film type actuator as shown in FIG. 1 or 2, a thin substrate is formed of conductive ceramics previously sintered and having perovskite crystal structure, which is heated at 500–1400° C. In order to laminate an intermediate layer 2 containing platinum (Pt) or palladium (Pd) to the thin substrate 1, paste containing materials (Pt or Pd) for composing the intermediate layer 2 is applied by screen printing, dipping, coating or other known filmmaking technique onto one surface (FIG. 1) or both the top and back surfaces (FIG. 2) of the thin substrate 1.

Then, paste containing a material composing a piezoelectric film 3 (such as PZT or PMN) is applied by screen printing, dipping, coating or other known film-forming technique onto said intermediate layer 2, which is heated at 800–1300° C. to laminate the piezoelectric film 3 to the intermediate layer 2. Thereafter, paste containing a material composing the electrode film 4 is applied by the screen printing, dipping, coating or other known film-forming technique onto the piezoelectric film 3, and is heated at 500–1300° C. to laminate the electrode film 4 to the said piezoelectric film 3 integrally.

EXAMPLES

The embodiment of the piezoelectric film type actuator shown in FIG. 1 is described in the following.

Example 1

A slip was prepared by mixing acrylic ester copolymer emulsion as a binder and powder of $La_{0.2}Ca_{0.8}MnO_3$ with purity of 99.5% or higher with the average particle size of around 1–2 $\mu$m, and kneading in a ball mill for 20 hours to produce slip, and then, green sheets were produced from the slip by the tape-forming technique, which were burned at 1200–1400° C. for around one to five hours. Thus, thin substrates 1 were produced, which had approximately 0.2 mm thickness of conductive ceramics expressed in the composition formula of $La_{0.2}Ca_{0.8}MnO_3$. The specific electric resistance of this thin substrate 1 was measured to be 2.3×10$^{-3}$ $\Omega$.cm at room temperature.

Then, the piezoelectric film type actuator shown in FIG. 1 was produced by laminating an intermediate layer 2 of approximately 3 $\mu$m thickness onto the main surface of said thin substrate 1 by attaching, using screen printing method, Pt-containing paste with the average particle size of approximately 1 $\mu$m containing platinum 69% by weight and the rest organic binder, and by firing at 1200° C. for two hours.

Thereafter, a piezoelectric film 3 of about 14 $\mu$m thickness was laminated onto said intermediate layer 2 by attaching, using screen printing method, PZT paste with the average particle size of approximately 1 $\mu$m, approximately, 70% of which is lead zirconate-titanate by weight and the rest is organic binder, and, then, by firing at 1250° C. for two hours. Further, an electrode film 4 of about 0.8 $\mu$m thickness was laminated on the piezoelectric film 3 by applying organic gold paste using screen printing method, and by firing at 850° C. for fifteen minutes.

The relative dielectric constant of the piezoelectric film 3 composing the actuator was measured, and sintering performance and reaction with the thin substrate 1 of the piezoelectric film 3 were compared with comparing samples. As shown in Table 1, it is found that PZT crystals of the piezoelectric film 3 grew to the same size of crystals of the comparing sample, and that the piezoelectric film 3 was sintered sufficiently. La, Ca, Mn or other elements constituting the thin substrate 1 were not detected in the piezoelectric film 3. This means that the intermediate layer 2 served to prevent the reaction between the thin substrate 1 and the piezoelectric film 3. Accordingly, the relative dielectric constant, which is one of the most important properties of the piezoelectric film 3, was almost at the same level as the comparing sample, which means the piezoelectric/electrostrictive properties were not deteriorated.

TABLE 1

| present invention | Intermediate layer | Piezoelectric film | | |
|---|---|---|---|---|
| | | PZT crystal grain size | Elements detected by EPMA | relative dielectric constant |
| within scope | yes | about 2–3 $\mu$m | Pb,Ti,Zr | 2840 |
| Out of scope | no | about 1 $\mu$m | Pb,Ti,Zr Ca,Mn | 870 |
| Comparing sample | — | about 2–3 $\mu$m | Pb,Ti,Zr | 3200 |

The comparing sample used for comparison was a ceramic disc having the same composition with the piezoelectric film 3 on the both surfaces of which 0.8 $\mu$m thick metal electrodes were formed. This comparing sample and the piezoelectric film 3 of the piezoelectric film type actuator were observed by an electron microscope for their crystallization and by EPMA for their composition, and their relative dielectric constant was computed based on the capacity of capacitors measured by an impedance analyzer.

Another piezoelectric film type actuator out of the scope of the present invention, produced by using materials of the same composition and with the same conditions but by directly laminating the piezoelectric film 3 on the thin substrate 1 without interposing the intermediate metal-containing layer therebetween, was also compared with the comparing sample. As shown in Table 1, because the grain size of PZT crystals composing the piezoelectric film 3 of this sample were smaller than those of the comparing sample, sufficient sintering was not achieved.

Elements (Ca and Mn) composing the thin substrate 1 were also found out in the piezoelectric film 3 by EPMA, which shows the piezoelectric film 3 reacted with the thin substrate 1. As a result, the relative dielectric constant declined sharply to 870, compared to the comparing sample, clearly showing that the piezoelectric/electrostrictive property of the piezoelectric film 3 was degraded.

Accordingly, it was proved placing the intermediate layer 2 containing Pt between the thin substrate 1 and the piezoelectric film 3 restrained the reaction of the piezoelectric film 3 with the thin substrate 1. Thus, the piezoelectric film 3 can be sufficiently sintered, resulting in achievement of a piezoelectric film type actuator having the required piezoelectric/electrostrictive property. Similar results were obtained when any of the conductive ceramics expressed in the following composition formulae shown in Table 2 and having perovskite crystal structure was used for the thin substrate 1.

TABLE 2

| No. | Composition of conductive ceramics | Specific resistance ($\Omega \cdot cm$) |
| --- | --- | --- |
| 1 | $La_{0.6}Sr_{0.4}MnO_3$ | $5.7 \times 10^{-3}$ |
| 2 | $La_{0.6}Ca_{0.2}CrO_3$ | $6.9 \times 10^{-1}$ |
| 3 | $La_{0.3}Ca_{0.7}MnO_3$ | $7.1 \times 10^{-3}$ |
| 4 | $La_{0.05}Ca_{0.95}MnO_3$ | $5.4 \times 10^{-3}$ |
| 5 | $La_{0.2}Ca_{0.8}CoO_3$ | $4.6 \times 10^{-3}$ |

Piezoelectric film type actuators shown in FIG. 1 were produced with the same conditions of Embodiment 1 except a composite material made of platinum (Pt) and lead zirconate-titanate (PZT) was used for the piezoelectric film 3. Change in properties, when the content percentage of platinum (Pt) and lead zirconate-titanate (PZT) composing said piezoelectric film 3 was changed, was evaluated by the same method as described above.

The various patterns of content percentage of platinum (Pt) and lead zirconate-titanate (PZT) composing the piezoelectric film 3 and corresponding results are shown in Table 3.

TABLE 3

| | Intermediate layer composition | | Piezoelectric film | | | |
| --- | --- | --- | --- | --- | --- | --- |
| | Pt (wt%) | PZT (wt%) | PZT crystal grain size | Elements detected from PZT by EPMA | relative dielectric constant | Surface resistance $\Omega$ |
| 1 | 69 | 0 | 2–3 $\mu$m | Pb, Ti, Zr | 2880 | 0.9 |
| 2 | 60 | 9 | 2–3 $\mu$m | Pb, Ti, Zr | 2890 | 0.9 |

TABLE 3-continued

| | Intermediate layer composition | | Piezoelectric film | | | |
| --- | --- | --- | --- | --- | --- | --- |
| | Pt (wt%) | PZT (wt%) | PZT crystal grain size | Elements detected from PZT by EPMA | relative dielectric constant | Surface resistance $\Omega$ |
| 3 | 49 | 21 | 2–3 $\mu$m | Pb, Ti, Zr | 2520 | 1.1 |
| 4 | 41 | 30 | 2–3 $\mu$m | Pb, Ti, Zr, Ca, Mn | 2230 | 14.5 |
| *5 | 36 | 34 | 1–2 $\mu$m | Pb, Ti, Zr, Ca, Mn | 1050 | 170 |

The actuator with the * mark was out of the scope of the present invention.

Table 3 shows that the relative dielectric constant decreases and the surface electric resistance of the piezoelectric film 3 increases as the content of platinum (Pt) reduces in the intermediate layer. Moreover, as shown in the results of Sample No. 4 in Table 3, when the content of platinum (Pt) is lowered to 40% by weight, the elements such as Ca and Mn to be contained only in the thin substrate 1 were found in the piezoelectric film 3, although sintering characteristics of the piezoelectric film 3 was sufficient. This means that slight reaction occurred between the piezoelectric film 3 and the thin substrate 1 during firing. From these results, it was found that the intermediate layer 2 should contain platinum (Pt) in a amount of 40% or more by weight in order to prevent the deterioration of the piezoelectric/electrostrictive property.

Example 2

A thin substrate 1 of approximately 0.2 mm thickness made of conductive ceramics expressed in the composition formula of $La_{0.2}Ca_{0.8}MnO_3$ as produced by mixing a binder of ester acrylate copolymer emulsion to powder of $La_{0.2}Ca_{0.8}MnO_3$ of purity of 99.5% or higher with the average grain size of around 1–2 $\mu$m, and the mixture was kneaded in a ball mill for 20 hours to produce slip, and then, a green sheet was produced of said slip by tape-casting technique, which was fired at 1200–1400° C. for around one to five hours. The specific electric resistance measured of this thin substrate 1 was $2.3 \times 10^{-3}$ $\Omega$.cm at room temperature.

Then, A piezoelectric film type actuator shown in FIG. 1 was produced by laminating an intermediate layer 2 with about 3 $\mu$m thickness on the main surface of the thin substrate 1 by attaching, using screen printing method, Pd-containing paste with the average Palladum particle size of about 0.7 $\mu$m containing 60% of palladium (Pd) by weight and a remaining organic binder, and then by firing at 1200°0 C. for two hours. Then, a piezoelectric film 3 of about 14 $\mu$m thickness was laminated on said intermediate layer 2 by attaching, using the screen printing method, PZT-containing paste with the average PZT grain size of about 1 $\mu$m, about 70% of lead zirconate-titanate by weight and the remaining an organic binder, which then was heated at 1250 C. for two hours; further, an electrode film 4 of about 0.8 $\mu$m thickness was laminated onto said piezoelectric film 3 by attaching an organic gold paste by the screen printing method, and by firing the laminate at 850° C. for fifteen minutes.

The relative dielectric constant of said actuator produced was measured, and the sintering performance and the reaction of the piezoelectric film 3 with the thin substrate 1 were compared with a comparing sample. As shown in Table 4, the fact that PZT crystals of the piezoelectric film 3 grew to the same grain size that the crystals of the comparing sample grew shows that the piezoelectric film 3 was sintered sufficiently. Also, La, Ca, Mn or other elements composing the thin substrate 1 were not detected in the piezoelectric film 3. This shows that the intermediate layer 2 can perfectly prevent the any reaction between the thin substrate 1 and the piezoelectric film 3 during firing the laminate. Accordingly, the relative dielectric constant, which is one of the most important properties required in the piezoelectric film 3, was in almost the same level of the comparing sample, and the piezoelectric/electrostrictive properties were not deteriorated during firing. Thus, it was proved that interposing the intermediate layer 2 containing Pd between the thin substrate 1 and the piezoelectric film 3 can effectively prevent reaction of the piezoelectric film 3 with the thin substrate 1. The piezoelectric film 3 can be sintered sufficiently, which results in achievement of piezoelectric/electrostrictive property required in a piezoelectric film type actuator.

TABLE 4

|  | Intermediate layer | PZT crystal size | Piezoelectric film Elements detected by EPMA | relative dielectric constant |
| --- | --- | --- | --- | --- |
| invention | yes | About 2~3 μm | Pb, Ti, Zr | 2950 |
| comparison | no | About 2~3 μm | Pb, Ti, Zr | 3200 |

As described above, in the present invention, because the piezoelectric film type actuator is formed by laminating a piezoelectric film onto a thin substrate made of conductive ceramics having perovskite crystal structure through an intermediate layer containing 40% or more of platinum (Pt) or palladium (Pd) by weight attached on the thin substrate, a piezoelectric film type actuator can be achieved which can displace quickly in responsible speed in a large range by the traverse effect of distortion induce by electric field when even low voltage is applied, with the high integrating of the piezoelectric driving elements on the common thin substrate. Moreover, wiring patterns to the electrodes may be simplified or may not need at all, without giving adverse effect to the displacement of the thin substrate.

Therefore, the piezoelectric film type actuator of the present invention can be used, for instance, for an ink jet printer head, an ink jet printer head with simple structure capable of high speed printing may be provided.

What is claimed is:

1. A piezoelectric film type actuator, comprising a thin substrate formed of conductive ceramics having perovskite crystal structure, an intermediate layer containing platinum or palladium which is attached on the thin substrate and a piezoelectric film laminated on the intermediate layer, and an electrode film applied on said piezoelectric film.

2. A piezoelectric film type actuator according to claim 1, wherein the intermediate layer contains one or more compounds selected from a group of lead zirconate-titanate, lead—magnesium niobate, lead—nickel niobate, lead antimonate-stannate, lead titanate and barium titanate together with said platinum or palladium.

3. A piezoelectric film type actuator according to claim 1 or 2, wherein the intermediate layer contains said platinum or palladium in an amount of 40% or more by weight.

4. A piezoelectric film type actuator according to claim 1 or 2, wherein the conductive ceramics has composition expressed in the following formula;

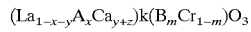

$(La_{1-x-y}A_xCa_{y+z})k(B_mCr_{1-m})O_3$ where, A is Sr or/and Ba, and B is one or more elements selected from the group of Mg, Zr, Ce, Mn, Fe, Co and Ni, $0.01 \leq x+y \leq 0.70$, $0<z \leq 0.1$, $0.90 \leq k \leq 1.05$, and, $0 \leq m \leq 1.0$.

5. An ink jet printer head comprising: a plurality of ink chambers which are defined by the same number of grooves divided by partition walls in a base frame; a thin substrate formed of a conductive ceramics having a perovskite crystal structure which covers said grooves; intermediate layers containing platinum or palladium formed on said thin substrate on a side opposite the ink chambers, each intermediate layer corresponding in position to an ink chamber; piezoelectric films formed on the intermediate layers; and electrode films formed on the piezoelectric films so as to constitute piezoelectric film type actuators.

6. An ink jet printer head according to claim 5, wherein the intermediate layers contains one or more compounds selected from a group of lead zirconate-titanate, lead—magnesium niobate, lead—nickel niobate, lead antimonate-stannate, lead titanate and barium titanate together with said platinum or palladium.

7. An ink jet printer head according to claim 5 or 6, wherein the intermediate layers contains said platinum or palladium in a amount of 40% or more by weight.

8. An ink jet printer head according to claim 5 or 6, wherein the conductive ceramics has composition expressed in the following formula;

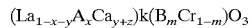

$(La_{1-x-y}A_xCa_{y+z})k(B_mCr_{1-m})O_3$ where, A is Sr or/and Ba, and B is one or more elements selected from the group of Mg, Zr, Ce, Mn, Fe, Co and Ni, $0.01 \leq x+y \leq 0.70$ $0<z \leq 0.1$ $0.90 \leq k \leq 1.05$ and, $0 \leq m \leq 1.0$.

9. A method for forming a piezoelectric film type actuator, comprising the step of:

forming a thin substrate from conductive ceramics having a perovskite crystal structure;

forming an intermediate layer containing platinum or palladium on the thin substrate;

forming a piezoelectric film on the intermediate layer; and forming an electrode film on the piezoelectric film.

10. The method of claim 9, wherein the intermediate layer further contains one or more compounds selected from the group consisting of lead zirconatetinanate, lead—magnesium niobate, lead—nickel niobate, lead antimonate-stannate, lead titanate and barium titanate.

11. The method of claim 9, wherein the intermediate layer contains the platinum or palladium in an amount of 40% or more by weight.

12. The method of claim 9, wherein the conductive ceramics has composition expressed in the following formula:

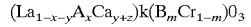

$(La_{1-x-y}A_xCa_{y+z})k(B_mCr_{1-m})O_3$ where, A is Sr or/and Ba, and B is one or more elements selected from the group of Mg, Zr, Ce, Mn, Fe, Co and Ni, $0.01 \leq x+y \leq 0.70$, $0<z \leq 0.1$, $0.90 \leq k \leq 1.05$, and, $0 \leq m \leq 1.0$.

13. A method for forming an ink jet printer head comprising the step of:

forming a plurality of grooves in a base frame;

covering the grooves in the base frame with a thin substrate formed of a conductive ceramics having a perovskite crystal structure to form a plurality of ink chambers;

forming intermediate layers containing platinum or palladium on a side of the thin substrate opposite the ink chambers, each intermediate layer corresponding in position to an ink chamber;

forming piezoelectric films on the intermediate layers; and forming electrode films on the piezoelectric films.

14. The method of claim 13, wherein the intermediate layer further contains one or more compounds selected from the group consisting of lead zirconatetinanate, lead—magnesium niobate, lead—nickel niobate, lead antimonate-stannate, lead titanate and barium titanate.

15. The method of claim 13, wherein the intermediate layer contains the platinum or palladium in an amount of 40% or more by weight.

16. The method of claim 13, wherein the conductive ceramics has composition expressed in the following formula:

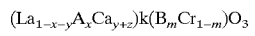

where, A is Sr or/and Ba, and B is one or more elements selected from the group of Mg, Zr, Ce, Mn, Fe, Co and Ni, $0.01 \leq x+y \leq 0.70$, $0 < z \leq 0.1$, $0.90 \leq k \leq 1.05$, and, $0 \leq m \leq 1.0$.

* * * * *